(12) United States Patent
Norman (10) Patent No.: US 11,621,365 B2
(45) Date of Patent: Apr. 4, 2023

(54) WATER SOLUBLE OXIDE LIFTOFF LAYERS FOR GAAS PHOTOVOLTAICS

(71) Applicant: Alliance for Sustainable Energy, LLC, Golden, CO (US)

(72) Inventor: Andrew Gordon Norman, Evergreen, CO (US)

(73) Assignee: Alliance for Sustainable Energy, LLC, Golden, CO (US)

(*) Notice: Subject to any disclaimer, the term of this patent is extended or adjusted under 35 U.S.C. 154(b) by 0 days.

(21) Appl. No.: 16/904,267

(22) Filed: Jun. 17, 2020

(65) Prior Publication Data

US 2020/0395500 A1 Dec. 17, 2020

Related U.S. Application Data

(60) Provisional application No. 62/862,381, filed on Jun. 17, 2019.

(51) Int. Cl.
*H01L 31/18* (2006.01)
*H01L 21/78* (2006.01)

(52) U.S. Cl.
CPC ...... *H01L 31/1852* (2013.01); *H01L 21/7813* (2013.01); *H01L 31/1804* (2013.01); *H01L 31/1892* (2013.01); *Y02E 10/544* (2013.01)

(58) Field of Classification Search
CPC ............ H01L 31/1852; H01L 31/1804; H01L 21/02433; H01L 21/02414; H01L 21/02483; H01L 21/02488; H01L 21/02631; H01L 21/02658; H01L 21/02546; H01L 21/02381; H01L 31/1892; H01L 21/02266; H01L 21/0331; H01L 21/0337; H01L 21/3086; H01L 21/7813; Y02P 70/50; Y02E 10/544; Y02E 10/547

See application file for complete search history.

(56) References Cited

U.S. PATENT DOCUMENTS

| | | | | |
|---|---|---|---|---|
| 4,255,208 A | * | 3/1981 | Deutscher | ........... H01L 31/1808 438/72 |
| 8,507,365 B2 | * | 8/2013 | Norman | ............ H01L 21/02433 438/478 |
| 8,961,687 B2 | * | 2/2015 | Norman | .............. H01L 21/0237 117/86 |
| 9,041,027 B2 | * | 5/2015 | Ptak | ..................... H01L 21/0242 257/94 |

(Continued)

FOREIGN PATENT DOCUMENTS

| | | | | |
|---|---|---|---|---|
| CN | 102696115 A | * | 9/2012 | ......... H01L 21/2007 |
| WO | WO-2010124059 A2 | * | 10/2010 | ............. C22C 21/00 |

OTHER PUBLICATIONS

Guo et al., An Effective Lift-Off Method for Patterning High-Density Gold Interconnects on an Elastomeric Substrate, Small (Weinheim an der Bergstrasse, Germany) vol. 6,24 (2010): 2847-52. doi:10.1002/smll.201001456 (Year: 2010).*

(Continued)

*Primary Examiner* — Earl N Taylor
(74) *Attorney, Agent, or Firm* — Sam J. Barkley (57) ABSTRACT

Disclosed herein are compositions, methods and devices that allow for water-soluble epitaxial lift-off of III-V. Epitaxial growth of STO/SAO templates on STO (001) and Ge (001) substrates were demonstrated. Partially epitaxial GaAs growth was achieved on STO/SAO/STO substrate templates.

3 Claims, 11 Drawing Sheets

(56) References Cited

U.S. PATENT DOCUMENTS 9,425,249 B2 * 8/2016 Norman ............ H01L 21/02439
2020/0395500 A1 * 12/2020 Norman ............ H01L 31/1852

OTHER PUBLICATIONS

Cheng et al., Epitaxial lift-off process for gallium arsenide substrate reuse and flexible electronics, Nat Commun 4, 1577 (2013). https://doi.org/10.1038/ncomms2583, pp. 1-7 (Year: 2013).*
Choi et al., A Repeatable Epitaxial Lift-Off Process from a Single GaAs Substrate for Low-Cost and High-Efficiency III-V Solar Cells, Adv. Energy Mater. 2014, 4, 1400589, pp. 1-6 (Year: 2014).*
Nam et al., Transfer Printed Flexible and Stretchable Thin Film Solar Cells Using a Water-Soluble Sacrificial Layer, Adv. Energy Mater. 2016, 6, 1601269, pp. 1-8 (Year: 2016).*
Harada et al., A versatile patterning process based on easily soluble sacrificial bilayers, AIP Advances 7, 085011 (2017), pp. 1-7 (Year: 2017).*
Seredyński et al., (Cd,Zn,Mg)Te-based microcavity on MgTe sacrificial buffer: Growth, lift-off, and transmission studies of polaritons, Physical Review Materials 2, 043406, 2018, pp. 1-7 (Year: 2018).*
Magginetti et al., Water-Assisted Liftoff of Polycrystalline CdS/CdTe Thin Films Using Heterogeneous Interfacial Engineering, Adv. Mater. Interfaces 2019, 6, 1900300, pp. 1-8 (Year: 2019).*
Kahn et al., Pulsed Laser Deposition of Epitaxial $Sr_3Al_2O_6$ as a Water-Soluble Sacrificial Layer for GaAs Deposition, APS March Meeting 2020, vol. 65, No. 1 (Year: 2020).*
Baek, D. J. et al., "Ultrathin Epitaxial Barrier Layer to Avoid Thermally Induced Phase Transformation in Oxide Heterostructures," ACS Applied Material Interfaces, vol. 9, 2017, 6 pages.
Bedell, S. et al., "Kerf-Less Removal of Si, Ge, and III-V Layers by Controlled Spalling to Enable Low-Cost PV Technologies," IEEE Journal of Photovoltaics, vol. 2, No. 2, Apr. 2012, 7 pages.
Connell, J.G. et al., "Preparation of atomically flat $SrTiO_3$ surfaces using a deionized-water leaching and thermal annealing procedure," Applied Physics Letters, vol. 101, 2012, 3 pages.
Flemish, J.R. et al., "Selective Wet Etching of GaInP, GaAs, and InP in Solutions of HCl, CH3COOH, and H2O2," Journal of the Electrochemical Society, vol. 140, No. 3, Mar. 1993, 5 pages.
Hong, S. et al., "Extreme tensile strain states in $La_{0.7}Ca_{0.3}MnO_3$ membranes," Science, vol. 368, 2020, 5 pages.
Horowitz, K. et al., "A Techno-Economic Analysis and Cost Reduction Roadmap for III-V Solar Cells," NREL Technical Report, NREL/TP-6A20-72013, Nov. 2018, 35 pages.
Ji, D. et al., "Freestanding crystalline oxide perovskites down to the monolayer limit," Nature, vol. 570, Jun. 2019, 4 pages.
Kahlenberg, V., "$Sr_3(Al_{0.36}Ga_{0.64})_2O_6$—a new Strontium Aluminum Gallate," Cryst. Res. Technol., vol. 35, 2000, 9 pages.
Kahlenberg, V., On the Crystal Structure of Tribarium Gallate ($Ba_3Ga_2O_6$), Cryst. Res. Technol., vol. 36, 2001, No. 3, 8 pages.
Kahlenberg, V., "The Crystal Structures of the Strontium Gallates $Sr_{10}Ga_6O_{19}$ and $Sr_3Ga_2O_6$," Journal of Solid State Chemistry, vol. 160, 2001, 9 pages.
Konagai, M. et al., "High Efficiency GaAs Thin Film Solar Cells by Peeled Film Technology," Journal of Crystal Growth, vol. 45, 1978, 4 pages.
Lazic, B. et al., "On the symmetry of $Ba_3Al_2O_6$—X-ray diffraction and Raman spectroscopy studies," Solid State Sciences, vol. 11, 2009 8 pages.
Lu, D. et al., "Synthesis of freestanding single-crystal perovskite films and heterostructures by etching of sacrificial water-soluble layers," Nature Materials, vol. 15, Dec. 2016, 7 pages.
Niehaus, O. et al., "Crystal structure of the europium(II) aluminate $Eu_3Al_2O_6$," Z. Naturforsch., vol. 70, No. 2b, 2015; 5 pages.
Prodjosantoso, A.K. et al., "Synthesis and Structural Studies of Strontium-Substituted Tricalcium Aluminate $Ca_{3-x}Sr_xAl_2O_6$," Australian Journal of Chemistry, vol. 53, 2000, 9 pages.
Rance, W.L. et al., "Epitaxial growth of InGaAs on $MgAl_2O_4$ spinel for one-sun photovoltaics," Journal of Crystal Growth, vol. 363, 2013, 4 pages.
Sato, H.K. et al., "Nanometer-scale epitaxial strain release in perovskite heterostructures using "SrAlOx" sliding buffer layers," Applied Physics Letters, vol. 98, 2011, 3 pages.
Wang, X. et al., "Synthesis of free-standing $Ga_2O_3$ films for flexible devices by water etching of $Sr_3Al_2O_6$ sacrificial layers," Chinese Physical Society and IOP Publishing Ltd., vol. 28, No. 1, 2019, 6 pages.
Ward, J. S. et al., "Techno-economic analysis of three different substrate removal and reuse strategies for III-V solar cells," Progress in Photovoltaics: Research and Applications, vol. 24, 2016, 9 pages.
Woodhouse, M. et al.., "A Manufacturing Cost Analysis Relevant to Single- and Dual-Junction Photovoltaic Cells Fabricated with III-Vs and III-Vs Grown on Czochralski Silicon," NREL/PR-6A20-60126, Sep. 30, 2013, 92 pages.
Yablonovitch, E. et al., "Extreme selectivity in the lift-off of epitaxial GaAs films," Applied Physics Letters, vol. 51, No. 26, Dec. 28, 1987, 3 pages.
Zakharchuk, K.V. et al., "Electrical properties and thermal expansion of strontium aluminates," Journal of Alloys and Compounds, vol. 613, 2014, 6 pages.

* cited by examiner

WATER SOLUBLE OXIDE LIFTOFF LAYERS FOR GAAS PHOTOVOLTAICS

CROSS-REFERENCE TO RELATED APPLICATIONS

This application claims priority under 35 U.S.C. § 119 to U.S. Provisional Patent Application No. 62/862,381, filed on 17 Jun. 2019, the contents of which are hereby incorporated by reference in their entirety.

CONTRACTUAL ORIGIN

The United States Government has rights in this invention under Contract No. DE-AC36-08GO28308 between the United States Department of Energy and the Alliance for Sustainable Energy, LLC., the Manager and Operator of the National Renewable Energy Laboratory.

BACKGROUND

The high cost of single crystal GaAs and Ge wafers presently limits the widescale deployment of GaAs based PV.

III-V solar cell technology enjoys a near monopoly in outer-space application due to high energy density and reliability. Single and multi junction III-V solar cells exhibited record high efficiency under one sun (global AM 1.5 spectrum) [1]. Still the terrestrial application of GaAs solar cells is limited due to both the particularly high costs related to the required single crystal substrates and the epitaxial growth. Techno-economic analysis reveal that approximately 84% of this cost is due to the required expensive high-quality substrate [2]. A cost-effective substrate reuse technology can significantly bring down the total expense of the technology to enable widespread application. The PV community has been heavily exploring different substrate reuse strategy such as epitaxial lift-off (ELO), mechanical spalling and porous Ge release layer. However, the usefulness of all the existing techniques is limited due to the need for toxic etchants, substrate re-polishing and/or expensive intermediate process steps. ELO is the most matured of the substrate reuse technologies and proprietary techniques are already being used at small scale in the industry [ref]. GaAs for solar cell fabrication using ELO was demonstrated as early as 1978, where an AlGaAs sacrificial layer was selectively etched by using hydrofluoric acid. Since then, this method has been greatly improved [3] and different other techniques have been developed employing different sacrificial layers and etchant chemicals [4][5]. Most of these chemicals are environmentally unfavorable. More importantly, high quality GaAs growth on these recycled substrates after ELO becomes challenging due to surface roughness. Hence, there is a pressing need to develop new eco-friendly and cost-effective substrate removal and reuse techniques.

SUMMARY

In an aspect, disclosed herein is a method for making photovoltaics by using a water-soluble lift off layer upon which GaAs is epitaxially grown. In an embodiment, disclosed herein are methods for making a photovoltaic device by using a water-soluble lift off layer upon which GaAs is epitaxially grown.

In an aspect, disclosed herein is a method for making photovoltaics comprising using a water-soluble lift off layer upon which GaAs is epitaxially grown. In an embodiment, the water-soluble lift off layer is $Sr_3Al_2O_6$. In an embodiment, the water-soluble lift off layer is $Sr_3Ga_2O_6$. In an embodiment, the water-soluble lift off layer is $Eu_3Al_2O_6$. In an embodiment, the water-soluble lift off layer is $Ca_3Al_2O_6$.

In aspect, disclosed herein is a method for epitaxial growth of $Sr_3Al_2O_6$ on $SrTiO_3$ comprising the step of epitaxial lift off of perovskite oxide layers on $SrTiO_3$ substrates. In an embodiment, the $SrTiO_3$ substrate is a single crystal substrate. In another embodiment, the perovskite oxide layers are grown by pulsed laser deposition. In an embodiment, the method lacks an annealing step.

In an aspect, disclosed herein is a method for the epitaxial growth of a compound of interest on a $SrTiO_3/Sr_3Al_2O_6/SrTiO_3$ template comprising metalorganic vapor phase epitaxy (MOVPE) and comprising using a water-soluble lift off layer upon which the compound of interest is epitaxially grown. In an embodiment, the water-soluble lift off layer is $Sr_3Al_2O_6$. In an embodiment, the water-soluble lift off layer is $Sr_3Ga_2O_6$. In an embodiment, the water-soluble lift off layer is $Eu_3Al_2O_6$. In an embodiment, the water-soluble lift off layer is $Ca_3Al_2O_6$. In an embodiment, the method further includes the use of pulsed laser deposition. In an embodiment, the growth comprises using pulsed laser deposition and further comprises the growth of a $SrTiO_3$ capping layer upon the $Sr_3Al_2O_6$ layer. In an embodiment, the compound of interest is GaAs. In another embodiment, the compound of interest is Si. In yet another embodiment, the compound of interest is InP. In an embodiment, the method lacks an annealing step.

BRIEF DESCRIPTION OF THE DRAWINGS

FIGS. 2a, 2b and 2c depict an embodiment of water-soluble epitaxial liftoff

DETAILED DESCRIPTION

Despite the record high efficiency for GaAs solar cells, its terrestrial application is limited due to both the particularly high costs related to the required single crystal substrates and the epitaxial growth. A water-soluble lift off layer could reduce costs by avoiding the need for toxic etchants, substrate re-polishing and expensive process steps. $Sr_3Al_2O_6$ (SAO) is a water soluble, cubic oxide and $SrTiO_3$ (STO) is a perovskite oxide, where $a_{SAO}=4*a_{STO}=(2\sqrt{2})a_{GaAs}$. The pulsed laser deposited epitaxial growth of $SrTiO_3/Sr_3Al_2O_6$ templates for epitaxial GaAs growth was investigated. In this template, SAO works as a sacrificial layer and STO is the seed layer for GaAs growth that also protects the hygroscopic SAO during substrate transfer between deposition chambers. Pulsed laser deposited STO/SAO on either STO or Ge substrates is polycrystalline for substrate temperatures lower than 900° C., however the SAO films could be epitaxially crystallized partially by high temperature annealing. Careful optimization of the growth parameters for obtaining epitaxial SAO was explored, and we identified that the SAO film quality is strongly dependent on the growth temperature and $O_2$ partial pressure. XRD spectra for the films with optimized deposition parameters showed epitaxial SAO aligned to the STO (100) substrate. TEM analysis revealed that the grown SAO films are epitaxially crystalline throughout the thickness. The epitaxial growth of the STO capping layer is a qualitative indication for the high quality of the SAO surface. MOVPE growth of GaAs on sacrificial STO/SAO templates was explored, and partial epitaxy of the GaAs films was observed.

A water-soluble lift off layer could become just that, by avoiding the aforementioned potential downsides. $Sr_3Al_2O_6$ (SAO) is a hygroscopic cubic oxide that is highly water soluble. SAO has been demonstrated as sacrificial buffer layer for epitaxial lift-off of perovskite oxides and polycrystalline $Ga_2O_3$. Another attractive property of SAO for epitaxial buffer application is its mechanical flexibility, facilitating gradual strain control of the overlaying epitaxial film. SAO has a lattice constant of 1.5848 nm, which is close to $(2\sqrt{2})aGaAs=1.599$ nm, giving a close lattice match between SAO <100> and GaAs <100> after 45° lattice rotation. Due to the similarity of GaAs and Ge lattices, similar relation between Ge and SAO also holds. $SrTiO_3$ (STO) on the other hand is a perovskite oxide with much smaller unit cells. However, in this case 4*aSTO=1.562 nm, giving a lattice match between a single unit-cell of SAO and four unit-cells of STO. Four unit-cells of STO can coincidently lattice match with 45° lattice rotated GaAs <100> (see Table 1).

TABLE 1

Unit cell properties of the relevant material crystals.

| Material | Crystal Structure | Space group | Lattice Constant, a (nm) | 4 * a (nm) | 2√2 * a (nm) |
|---|---|---|---|---|---|
| $Sr_3Al_2O_6$ | Cubic | Pa-3 | 1.5848 | — | — |
| Ge | Diamond | Fd-3m | 0.5657 | — | 1.600 |
| $SrTiO_3$ | Perovskite | Pm-3m | 0.3905 | 1.562 | — |
| GaAs | ZincBlende | F-43m | 0.5653 | — | 1.599 |

We explored the epitaxial growth of SAO by Pulsed Laser Deposition (PLD), and GaAs growth by Metalorganic vapor-phase epitaxy (MOVPE). Due to the required vacuum break and the extremely hygroscopic nature of SAO, a PLD grown STO capping layer was deposited on top. We investigated this STO/SAO templates on GaAs, Ge and STO substrates, however, GaAs substrates couldn't withstand the required high temperature and $O_2$ partial pressure of epitaxial quality SAO growth. Here we only report the STO/SAO growth results on Ge and STO substrates. Optimum growth conditions (substrate temperature and $O_2$ partial pressure) for STO/SAO templates on STO substrates were identified based on XRD and TEM data of the films. Growth on STO substrates were of superior quality, hence, GaAs growths were only attempted on STO/SAO/STO templates. Substantial amount of epitaxially oriented GaAs (001) grains was observed of the GaAs films on these templates. Optimization of the MOVPE deposition conditions may further improve the GaAs film quality.

In an embodiment, Si and InP can be grown by using the methods disclosed herein for making GaAs films.

Disclosed herein is a release layer, SAO, with a lattice constant favorable to GaAs that is used as an intermediate layer between the substrate and the absorber layer. After the absorber layer is grown on SAO, it can be removed by applying water to the soluble SAO layer to separate the absorber layer from the substrate, thus allowing the substrate to be reused in the growth of another absorber layer. In an embodiment, disclosed herein is a novel water-soluble oxide $Sr_3Al_2O_6$ (SAO) lift off layer that has a close coincidence site lattice match to GaAs. In an embodiment, as disclosed herein is that epitaxial SAO is obtained on STO substrates after post growth annealing of PLD layers. In another embodiment, the nucleation and growth of GaAs on the SAO on STO templates is disclosed.

Figure 1:
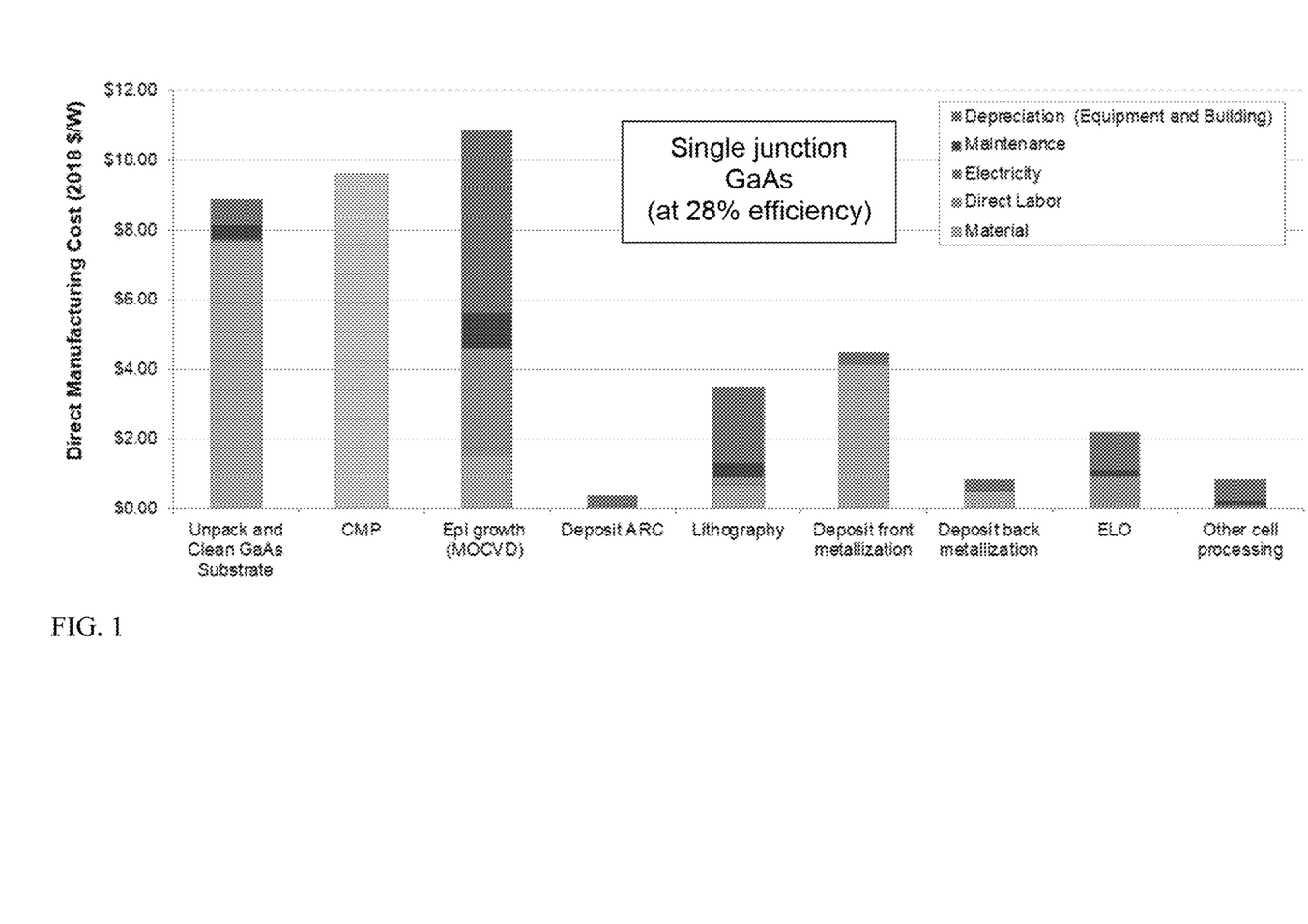
FIG. 1 depicts and embodiment of the step-by-step cost breakdown for a single junction, 28% efficiency, GaAs cell with five times substrate reuse.
Figure 2A:
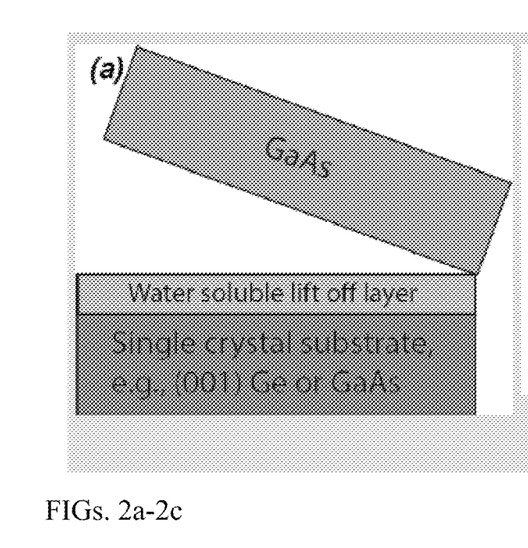
FIG. 2a is a schematic showing the concept of using a water-soluble epitaxial lift off layer for GaAs-based photovoltaic devices.
Figure 2B:
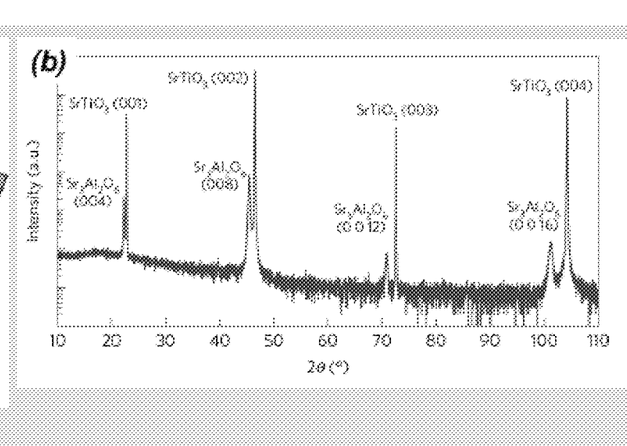
FIG. 2b depicts the spectrum from a X-ray diffraction (XRD) of a material having epitaxial growth of $Sr_3Al_2O_6$ (SAO) on $SrTiO_3$ (STO) substrate.
Figure 2C:
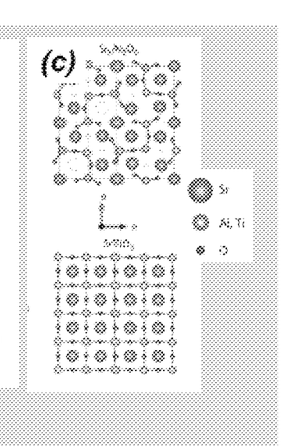
FIG. 2c is a diagram depicting the similarity between SAO and STO crystal structures.

FIG. 1 depicts the results of techno-economic analyses for GaAs based photovoltaic production and shows the relatively high cost of single crystal GaAs substrates. As depicted in FIG. 1, the chemical mechanical polishing (CMP) that is often required between epitaxial growth cycles contributes to a large portion of the costs of production of photovoltaics. By using methods and compositions disclosed herein, the costs of production of photovoltaics at the unpacking and cleaning of GaAs substrates and CMP steps are substantially reduced.

In an embodiment, a water-soluble epitaxial lift-off layer avoids the need for expensive, hazardous, chemical etchants, speeds up the lift-off process, and eliminates the need for expensive substrate re-polishing between epitaxial growth cycles.

In an embodiment, $Sr_3Al_2O_6$ (SAO) is used as a water-soluble oxide that is incorporated into a photovoltaic production for the epitaxial lift-off of perovskite oxide layers grown by pulsed laser deposition (PLD) on $SrTiO_3$ (STO) single crystal substrates. As disclosed herein, a novel, water soluble oxide lift-off layer can be applied to lower the cost of production of GaAs-based photovoltaics. In an embodiment, the water soluble oxide lift-off layer is $Sr_3Ga_2O_6$. In an embodiment, the water soluble oxide lift-off layer is $Eu_3Al_2O_6$. In an embodiment, the water soluble oxide lift-off layer is $Ca_3Al_2O_6$.

Figures 3A, 3B:
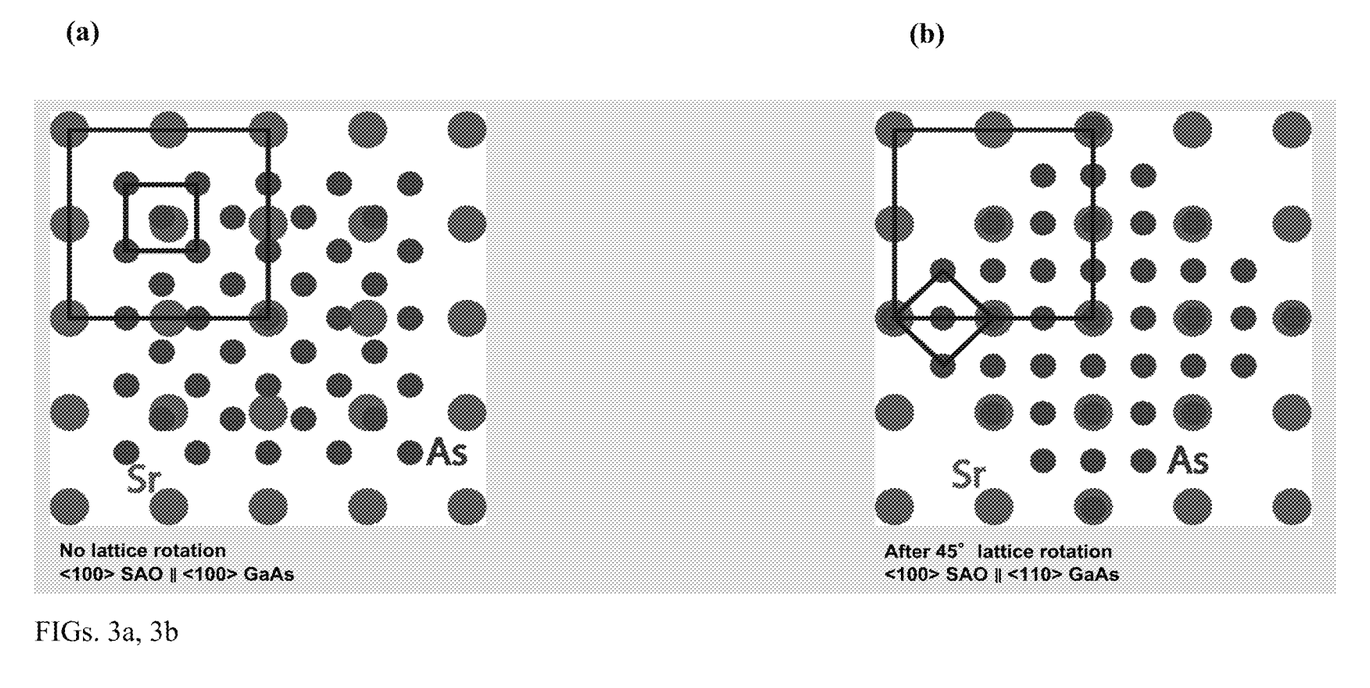
FIGS. 3a and 3b depict the close coincidence site lattice match between cubic SAO (having a lattice parameter 1.5848 nm) and cubic GaAs (having a lattice parameter 0.5653 nm) after a lattice rotation of 45 degrees.
Figures 4A, 4B, 4C:
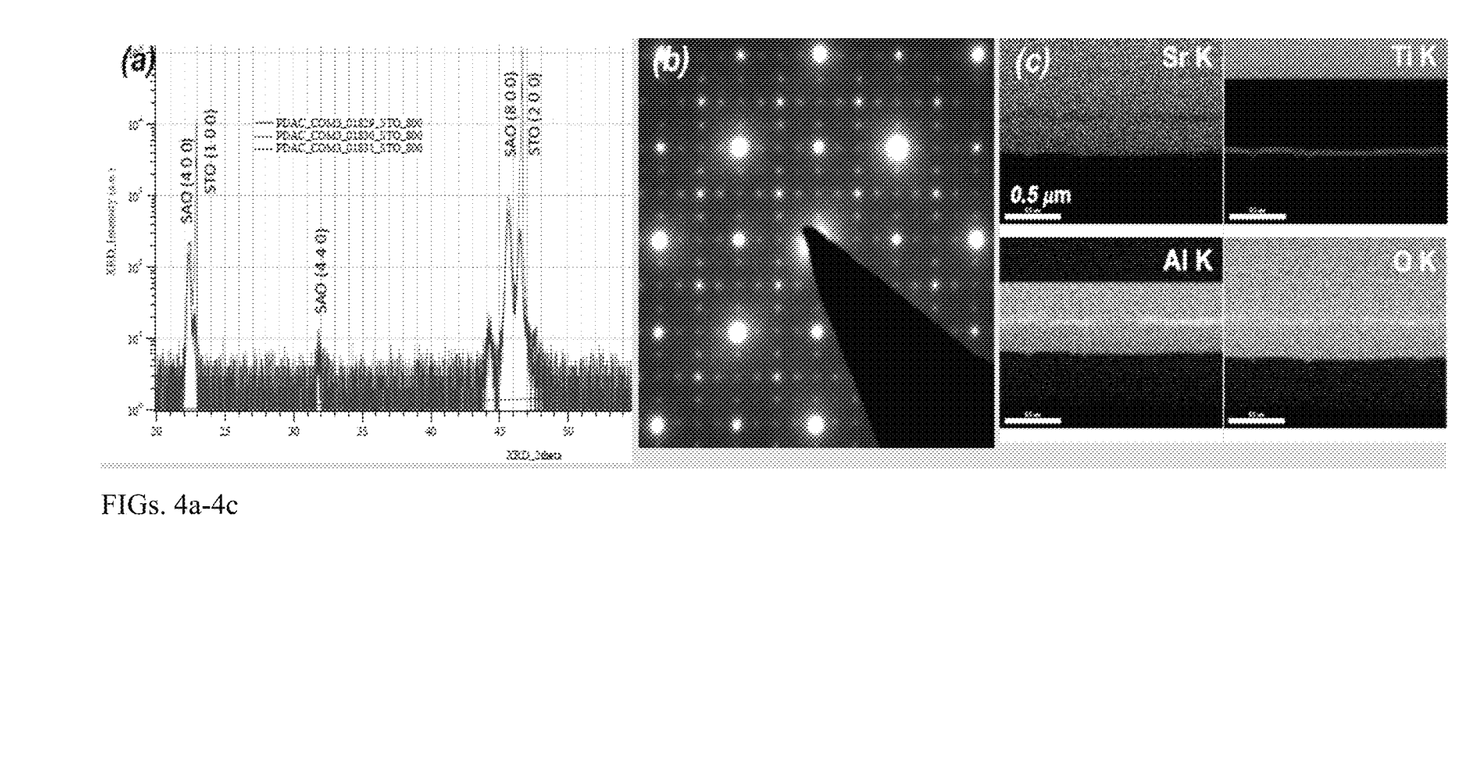
FIG. 4a depicts XRD results from three epitaxial SAO layers formed on STO substrates.
FIG. 4b depicts a selected area electron diffraction pattern taken at a <100> STO pole, across the interface between SAO and STO showing epitaxial alignment.
FIG. 4c depicts scanning transmission electron microscopy (STEM) energy dispersive x-ray spectroscopy (EDS) atomic percent maps that show a SAO layer having a thin STO capping layer grown on STO substrate by pulsed laser deposition (PLD).
Figure 5A:
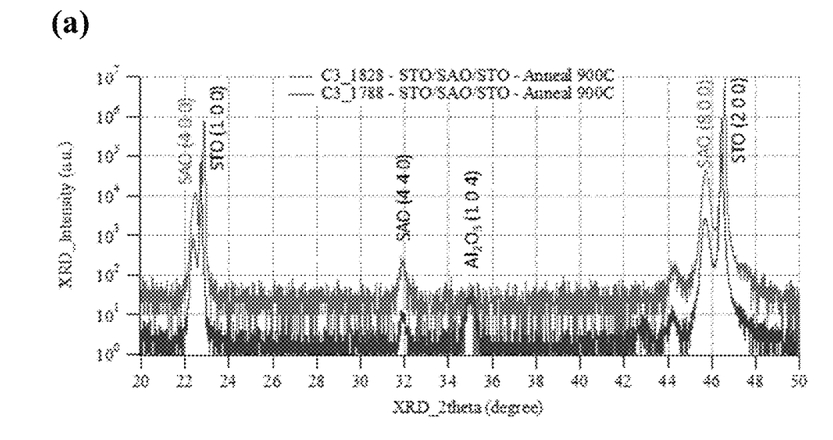
FIG. 5a depicts XRD data of epitaxial SAO (100) on STO (100) substrate after ex situ anneal.
Figure 5B:
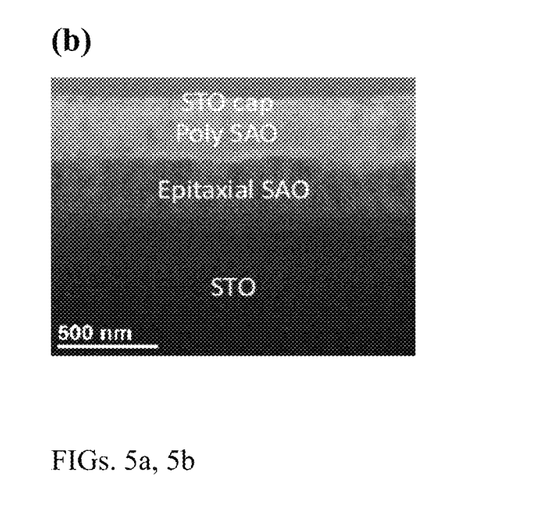
FIG. 5b depicts a TEM image: SAO layer closest to STO interface is epitaxial after ex-situ annealing, confirmed from the TED diffraction pattern.

As depicted in FIG. 3, GaAs is very close to being lattice matched to SAO after a 45° rotation of the cubic lattices. Cubic, zincblende GaAs has a lattice parameter of 0.5653 nm, while cubic SAO has a lattice parameter of 1.5848 nm. However, a close coincidence site lattice match is obtained after a rotation of 45 degrees between the two crystal lattices. This enables high quality, low defect density GaAs layers to be epitaxially grown on SAO epitaxial lift-off layers.

Epitaxially aligned SAO on STO was obtained after post growth annealing of PLD SAO layers as assessed by XRD and selected area electron diffraction. The reuse of a STO substrate for formation of epitaxial SAO layers was also achieved.

In another embodiment, the nucleation and growth of GaAs on the produced SAO on STO templates is contemplated.

Experimental Methods:

The SAO and STO films were deposited using a Neocera Combinatorial Pulsed Laser Deposition (PLD) System equipped with a Coherent COMPexPro 205 KrF excimer laser operating at 248 nm with a pulse duration of 10 ns. The laser with an energy of 160 mJ and a repetition rate of 20 Hz was focused on an area of 2.4×1.0 mm$^2$, on to a rotating 1" diameter commercial SAO or STO target. The vacuum chamber had a base pressure of 4×10−9 Torr. The samples were mounted on a temperature calibrated Inconel substrate holder and heated from a radiative heater.

STO (001) substrates from MTI Corporations were rinsed with acetone and isopropanol. Right before loading in the deposition chamber the STO substrates were held under running DI water for 1 minute, followed by $N_2$ blow dry. Then prior to the thin film deposition, the substrate was annealed at 950° C. with 0.01 mTorr $O_2$ for 30 minutes; this helps create an atomically flat titania terminated STO surface. The Ge (001) substrates from Umicrone were cleaned by the following steps—$NH_4OH+H_2O_2$ in water solution dip, water rinse, $HCl+H_2O_2$ in water solution dip, water rinse, and finally $N_2$ blow dry.

SAO was directly grown by PLD on the STO or Ge substrate at different substrate temperature and $O_2$ partial pressure. The STO capping layer, also by PLD, was grown at fixed Tsub=800° C. and an $O_2$ partial pressure of 50 mTorr without breaking vacuum. The crystallinity of the STO/SAO films was examined using a Rigaku SmartLab X-ray Diffraction (XRD) instrument emitting Cu Kα radiation; the diffracted beam was probed through a 2-bounce Ge (220) monochromator.

$Sr_3Al_2O_6$ Growth on $SrTiO_3$ (001) Substrate:

For PLD growth of SAO on STO (001) substrates, we identified that the critical parameters to achieve epitaxial SAO are the $O_2$ partial pressure and substrate temperature ($T_{sub}$). SAO grows amorphously unless the right condition is met. Ex situ annealing in atmospheric air environment at 800° C. can epitaxially crystallize amorphous deposited SAO. However, the samples are not epitaxial throughout its thickness. Polycrystalline SAO (440) and/or $Al_2O_3$ (104) are observed, evident from XRD and TEM data.

Figure 6A:
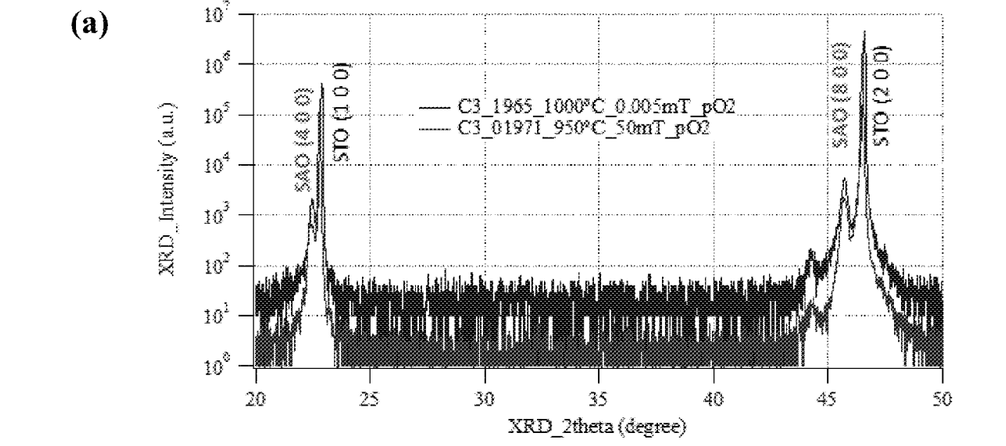
FIG. 6a depicts XRD data for STO/SAO templates deposited on STO (001) substrates.
Figure 6B:
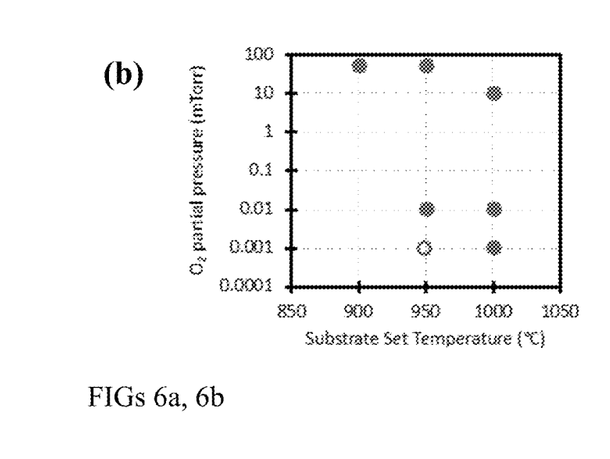
FIG. 6b depicts required $P(O_2)$ and $T_{Sub}$ for epitaxial PLD growth of SAO. Blank circle is indicating 'partial' epitaxy.

Direct PLD growth (no annealing) of epitaxial SAO on STO substrate is possible by optimizing $T_{sub}$ and $O_2$ partial pressure, FIG. 6 shows the ambient and temperature that resulted in epitaxially grown SAO. At higher P($O_2$), epitaxial growth is possible at lower Tsub, lowering the temperature requirement to 900° C. At the highest experimented $T_{sub}$, epitaxial SAO can be grown without any active $O_2$ flow; this could allow growing epitaxial SAO on substrates that gets oxidized. XRD data confirms the epitaxial SAO peaks, where no peaks related to non-epitaxial SAO or other phases are observed.

Figure 7:
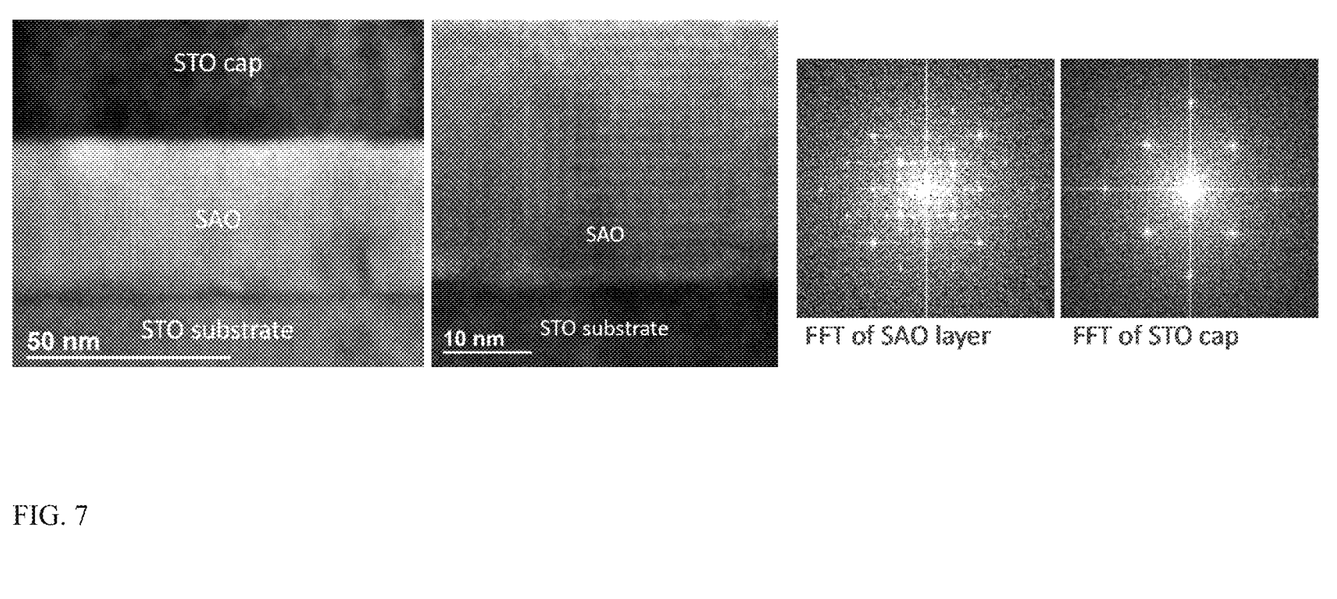
FIG. 7 depicts TEM data for STO/SAO templates deposited on STO (001) substrates.
Figure 8A:
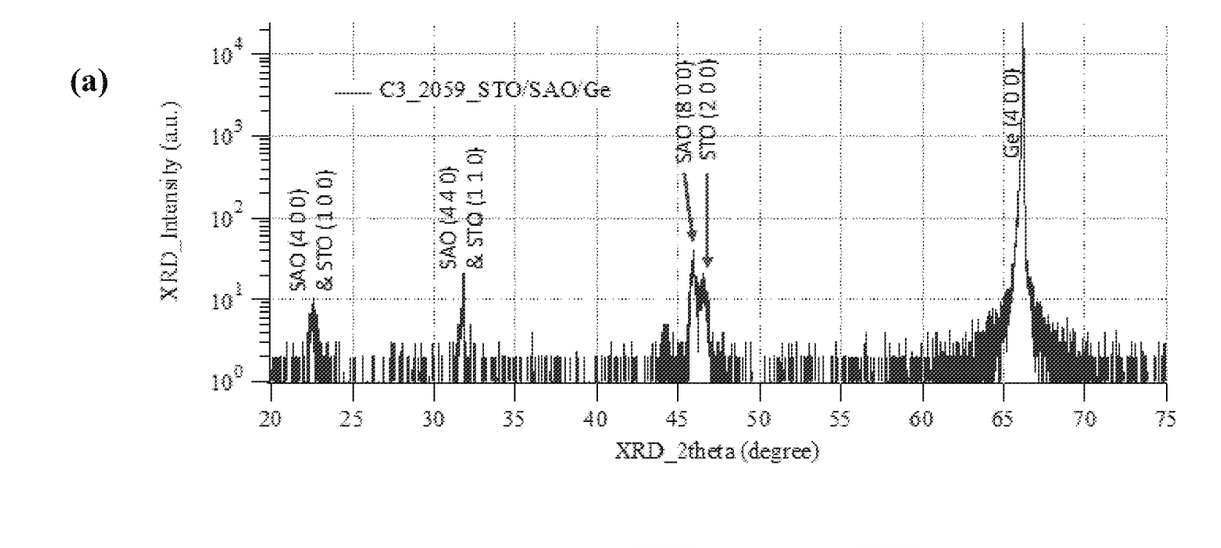
FIG. 8a depicts XRD data for STO/SAO templates deposited on Ge (001) substrates.
Figures 8A, 8B:
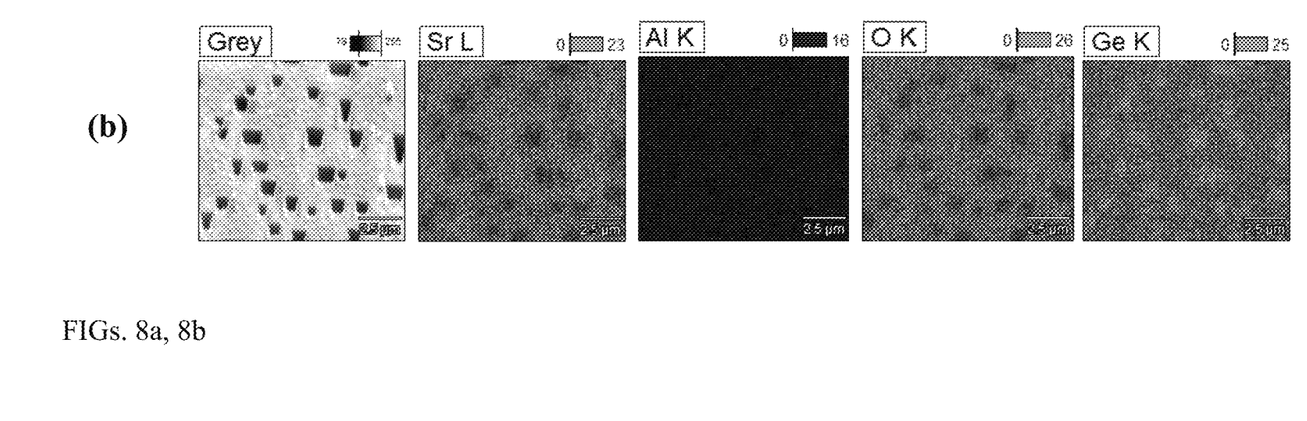
FIG. 8b depicts SEM and EDS data of STO/SAO/Ge templates.
Figure 9:
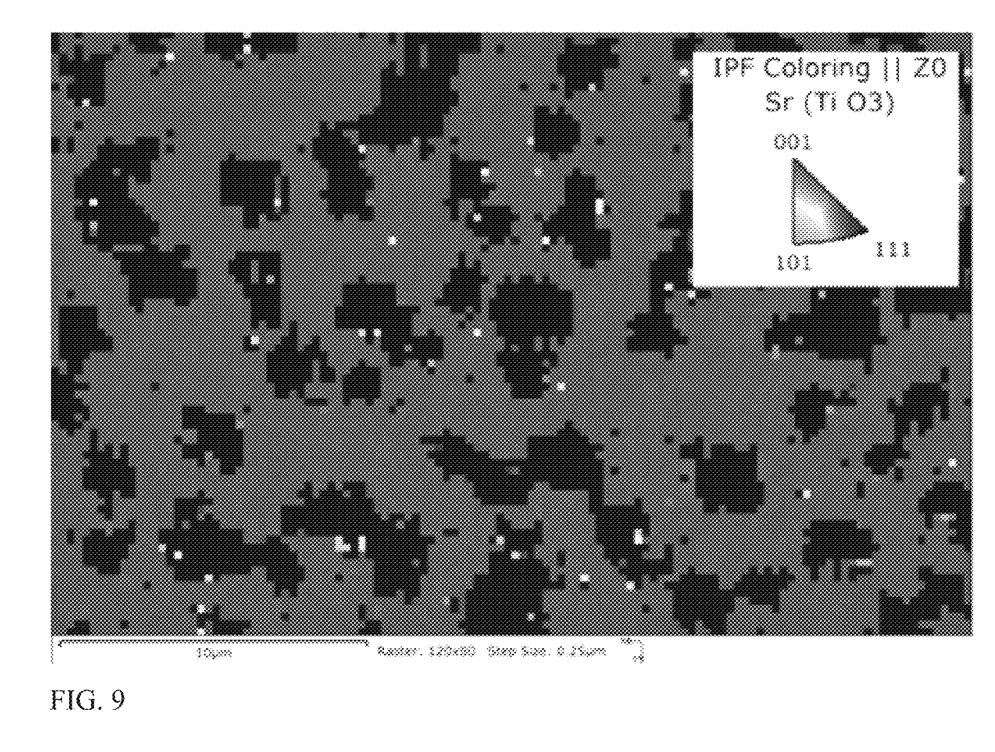
FIG. 9 depicts an EBSD map of the Ge/SAO/STO templates.

TEM data (see FIG. 7) confirms epitaxial SAO growth throughout the thickness of the stack. STO capping layer grown on SAO was also epitaxial. The epitaxial growth of the STO capping layer is a qualitative indication for the high quality of the SAO surface.

We also demonstrated reuse of a STO substrate after dissolving off the STO/SAO for formation of a second growth epi-SAO.

$Sr_3Al_2O_6$ Growth on Ge (001) Substrate:

Understanding of SAO growth on STO substrates were applied for growth attempts on Ge (001) substrates. For deposition attempts with $O_2$ flow resulted in completely oxidized substrates. For SAO deposition at 1000° C. with PO$_2$=5×10$^{-6}$ Torr, XRD data showed epitaxial SAO and STO peaks along with polycrystalline SAO(440) and/or STO(110) peak.

SEM showed pitted surface for the STO/SAO/Ge templates. These surface pits are possibly due to Ge oxidation, as EDS shows more Ge and less Sr, Al, and O in the pits. EDSD reveals that STO and SAO between surface pits are epitaxial with some scatter in orientation.

GaAs growth on $SrTiO_3/Sr_3Al_2O_6$ Templates

Figure 10:
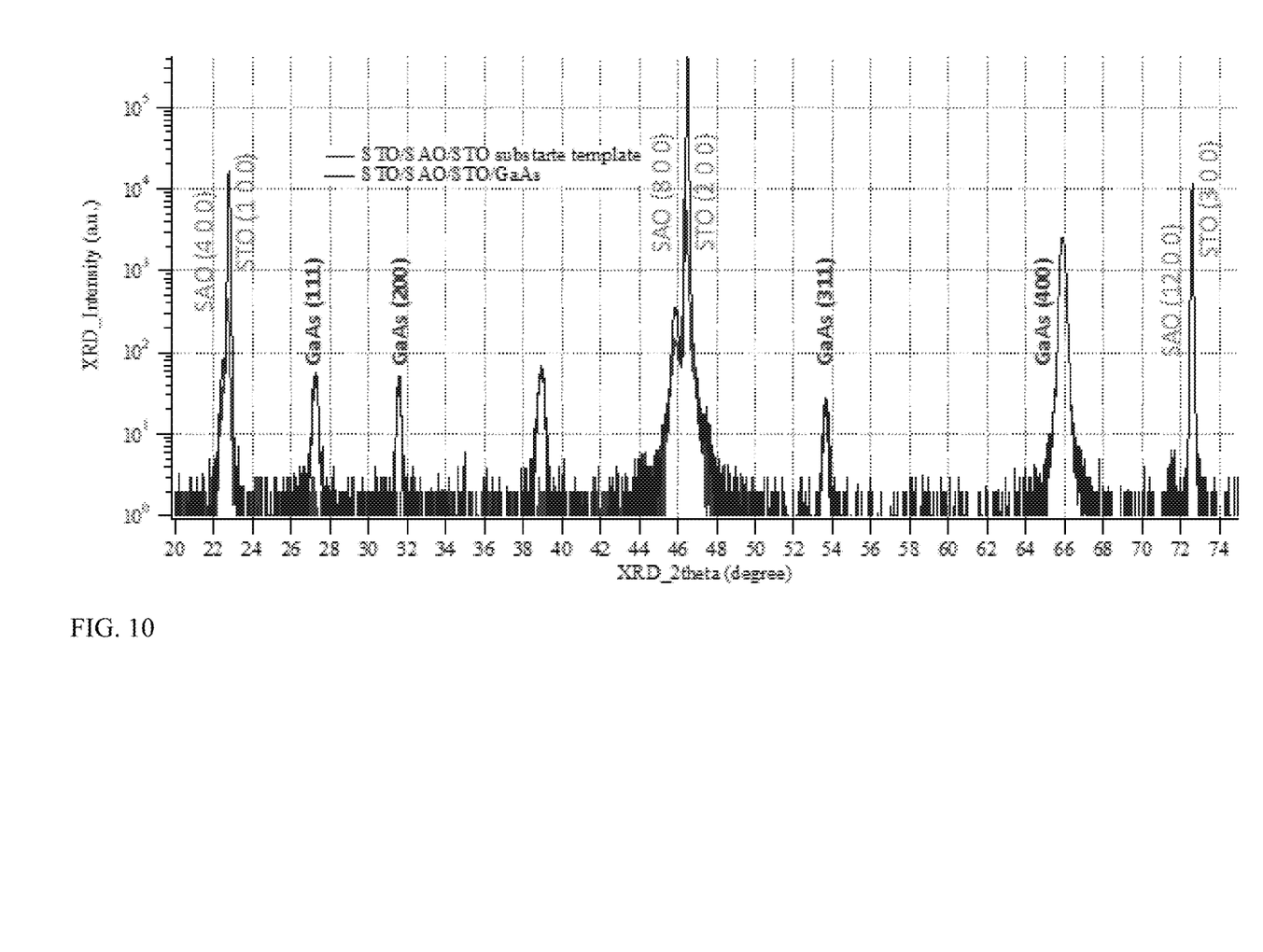
FIG. 10 depicts XRD data for STO/SAO templates deposited on Ge (001) substrates.

GaAs is grown by MOVPE on STO/SAO/STO template. XRD data indicate the presence of strong epitaxial GaAs (400) and (200) peaks along with several non-epitaxial GaAs peaks, see, for example, FIG. 10.

Figure 11:
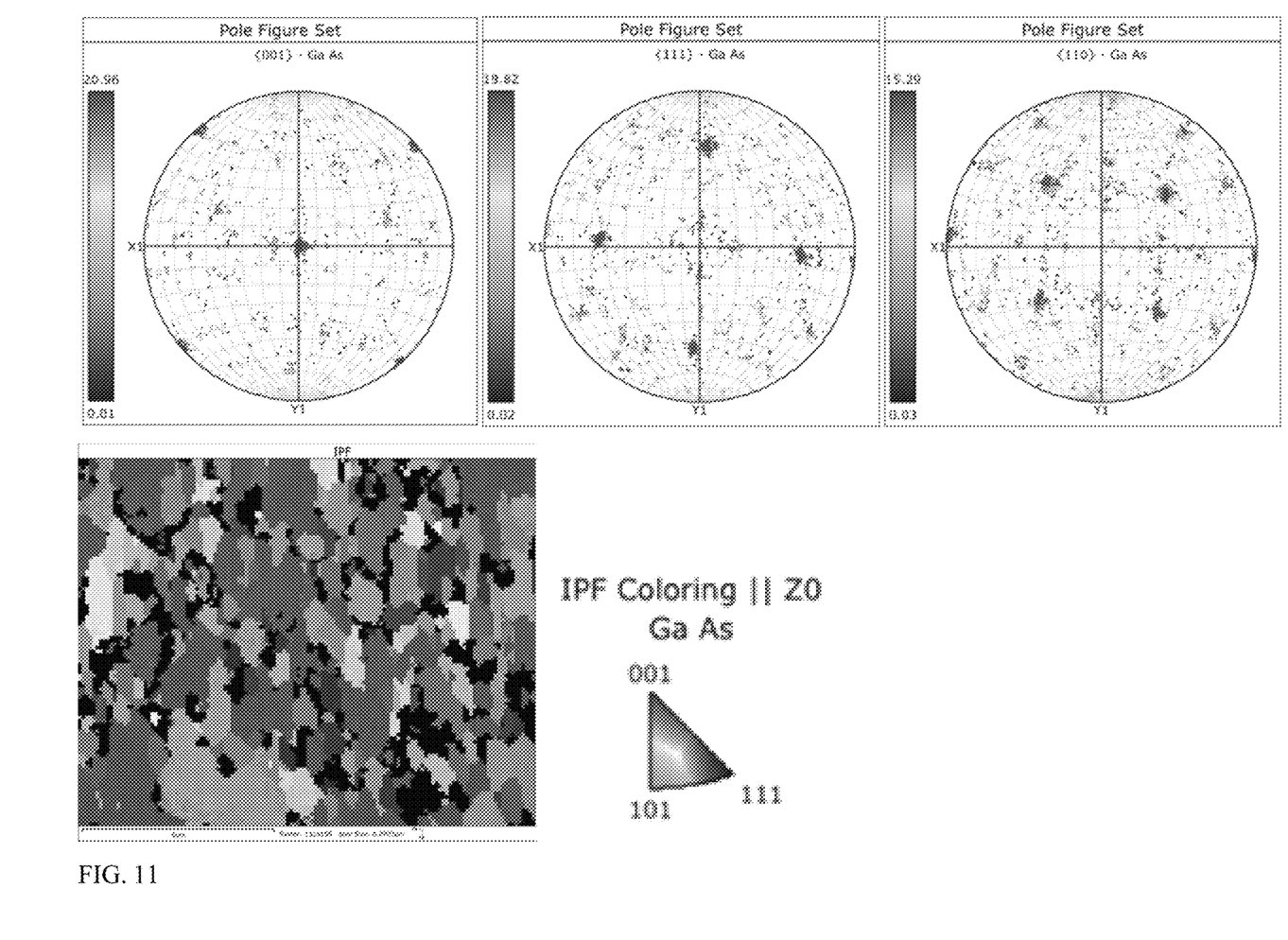
FIG. 11 depicts an EBSD map of the GaAs/STO/SAO/STO templates.

EBSD confirms a substantial amount of epitaxially oriented (001) grains (red areas in the IPF maps) in the GaAs, see, for example, FIG. 11. In an embodiment, optimization of the MOVPE growth parameters could help achieve higher quality GaAs films.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

Other objects, advantages, and novel features of the present invention will become apparent from the following detailed description of the invention when considered in conjunction with the accompanying drawings.

What is claimed is:

1. A method of making photovoltaics comprising providing a water-soluble lift off layer selected from the group consisting of $Sr_3Al_2O_6$, $Sr_3Ga_2O_6$, $Eu_3Al_2O_6$, and $Ca_3Al_2O_6$ on a substrate; epitaxially growing a GaAs layer upon the water-soluble lift off layer; and removing the GaAs layer by applying water to the water-soluble lift off layer to separate the GaAs layer from the substrate.

2. A method for epitaxially growing GaAs comprising providing a $SrTiO_3$ substrate layer and a water-soluble $Sr_3Al_2O_6$ lift off layer; epitaxially growing GaAs on the water-soluble lift off layer by metalorganic vapor phase epitaxy (MOVPE) and separating the grown GaAs from the $SrTiO_3$ substrate layer by applying water to the water-soluble lift off layer.

3. A method for epitaxially growing a compound selected from the group consisting of Si or InP comprising providing a $SrTiO_3$ substrate layer and a water-soluble lift off layer selected from the group consisting of $Sr_3Al_2O_6$, $Sr_3Ga_2O_6$, $Eu_3Al_2O_6$, and $Ca_3Al_2O_6$; epitaxially growing Si or InP on the water-soluble lift off layer by metalorganic vapor phase epitaxy (MOVPE); and separating the grown Si or InP from the $SrTiO_3$ substrate layer by applying water to the water-soluble lift off layer.

* * * * *